United States Patent
Economikos et al.

(10) Patent No.: US 10,546,853 B2
(45) Date of Patent: Jan. 28, 2020

(54) METAL RESISTORS INTEGRATED INTO POLY-OPEN-CHEMICAL-MECHANICAL-POLISHING (POC) MODULE AND METHOD OF PRODUCTION THEREOF

(71) Applicant: GLOBALFOUNDRIES Inc., Grand Cayman (KY)

(72) Inventors: Laertis Economikos, Wappingers Falls, NY (US); Hui Zang, Guilderland, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/016,058

(22) Filed: Jun. 22, 2018

(65) Prior Publication Data

US 2019/0393212 A1    Dec. 26, 2019

(51) Int. Cl.
| | |
|---|---|
| H01L 27/06 | (2006.01) |
| H01L 29/06 | (2006.01) |
| H01L 29/51 | (2006.01) |
| H01L 49/02 | (2006.01) |
| H01L 21/768 | (2006.01) |
| H01L 21/285 | (2006.01) |
| H01L 21/3213 | (2006.01) |
| H01L 29/66 | (2006.01) |

(52) U.S. Cl.
CPC .... *H01L 27/0629* (2013.01); *H01L 21/28518* (2013.01); *H01L 21/32139* (2013.01); *H01L 21/76834* (2013.01); *H01L 28/20* (2013.01); *H01L 29/0649* (2013.01); *H01L 29/517* (2013.01); *H01L 29/518* (2013.01); *H01L 29/66545* (2013.01)

(58) Field of Classification Search
CPC . H01L 27/0629; H01L 28/20; H01L 29/0649; H01L 29/517; H01L 29/518; H01L 29/66545
See application file for complete search history.

(56) References Cited

U.S. PATENT DOCUMENTS

| | | | |
|---|---|---|---|
| 5,275,963 A | 1/1994 | Cederbaum et al. | |
| 6,406,956 B1 | 6/2002 | Tsai et al. | |
| 7,397,087 B2* | 7/2008 | Chinthakindi | ...... H01L 27/0629 257/350 |
| 8,298,885 B2 | 10/2012 | Wei et al. | |
| 8,815,679 B1* | 8/2014 | Yen | .......... H01L 28/75 257/E21.021 |
| 2009/0051008 A1* | 2/2009 | Shin | ..... H01L 27/0629 257/536 |
| 2010/0059823 A1 | 3/2010 | Chung et al. | |
| 2010/0320509 A1* | 12/2010 | Knorr | ............... H01L 21/76832 257/288 |

(Continued)

*Primary Examiner* — Peniel M Gumedzoe
(74) *Attorney, Agent, or Firm* — Ditthavong & Steiner, P.C.

(57) ABSTRACT

A device including RM below the top surface of an HKMG structure, and method of production thereof. Embodiments include first and second HKMG structures over a portion of the substrate and on opposite sides of the STI region, the first and second HKMG structures having a top surface; and a RM over the STI region and between the first and second HKMG structures, wherein the RM is below the top surface of the first and second HKMG structures.

4 Claims, 8 Drawing Sheets

(56) References Cited

U.S. PATENT DOCUMENTS

| | | | | |
|---|---|---|---|---|
| 2010/0327378 A1* | 12/2010 | Tseng | ................ | H01L 21/28088 257/411 |
| 2011/0303982 A1* | 12/2011 | Chung | .............. | H01L 21/82387 257/363 |
| 2014/0011333 A1* | 1/2014 | McKee | ............... | H01L 23/5256 438/210 |
| 2014/0175609 A1* | 6/2014 | Montanini | .......... | H01L 27/0629 257/538 |

* cited by examiner

METAL RESISTORS INTEGRATED INTO POLY-OPEN-CHEMICAL-MECHANICAL-POLISHING (POC) MODULE AND METHOD OF PRODUCTION THEREOF

TECHNICAL FIELD

The present disclosure relates to semiconductor devices, including integrated circuits (ICs). The present disclosure is particularly applicable to resistive devices for high-k/metal gate (HKMG) technology and methods of fabrication.

BACKGROUND

System-on-chip (SoC) requires precision resistors integrated with complementary metal-oxide-semiconductor (CMOS). However, conventional poly resistors are no longer feasible due to incompatibility with HKMG technology. A middle-of-line (MOL) resistor metal (RM) is an option, since they are compatible with HKMG, but are formed above the interlayer dielectric (ILD) causing topography issues and incompatibility with self-aligned contact (SAC).

A need therefore exists for devices with improved RM integration to resolve topography and incompatibility issues, and for enabling methodology.

SUMMARY

An aspect of the present disclosure is a device including RM below the top surface of an HKMG structure.

Another aspect of the present disclosure is a method of forming RM below the top surface of an HKMG structure.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a device including: first and second HKMG structures over a portion of a substrate and on opposite sides of an STI region, the first and second HKMG structures having a top surface; and a RM over the STI region and between the first and second HKMG structures, wherein the RM is below the top surface of the first and second HKMG structures.

Another aspect of the present disclosure is a method including: forming first and second HKMG structures over a portion of a substrate and on opposite sides of an STI region, the first and second HKMG structures having a top surface; and forming a RM over the STI region and between the first and second HKMG structures, wherein the RM is below the top surface of the first and second HKMG structures.

A further aspect of the present disclosure is a device including: a substrate including an STI region; first and second HKMG structures over a portion of the substrate and on opposite sides of the STI region, the first and second HKMG structures having a top surface; a contact etch stop layer (CESL) over the substrate, the STI region and on sidewalls of the first and second HKMG structures; an oxide layer over the CESL; and a RM including tungsten silicide (WSix) over the STI region and between the first and second HKMG structures, wherein the RM is below the top surface of the first and second HKMG structures.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems with SAC attendant upon forming RM above ILD. The problem is solved, inter alia, by forming RM embedded in MOL ILD and below the gate (PC) height.

Embodiments in accordance with the present disclosure include a device with first and second HKMG structures over a portion of a substrate and on opposite sides of an STI region, the first and second HKMG structures having a top surface, and a RM over the STI region and between the first and second HKMG structures, wherein the RM is below the top surface of the first and second HKMG structures.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
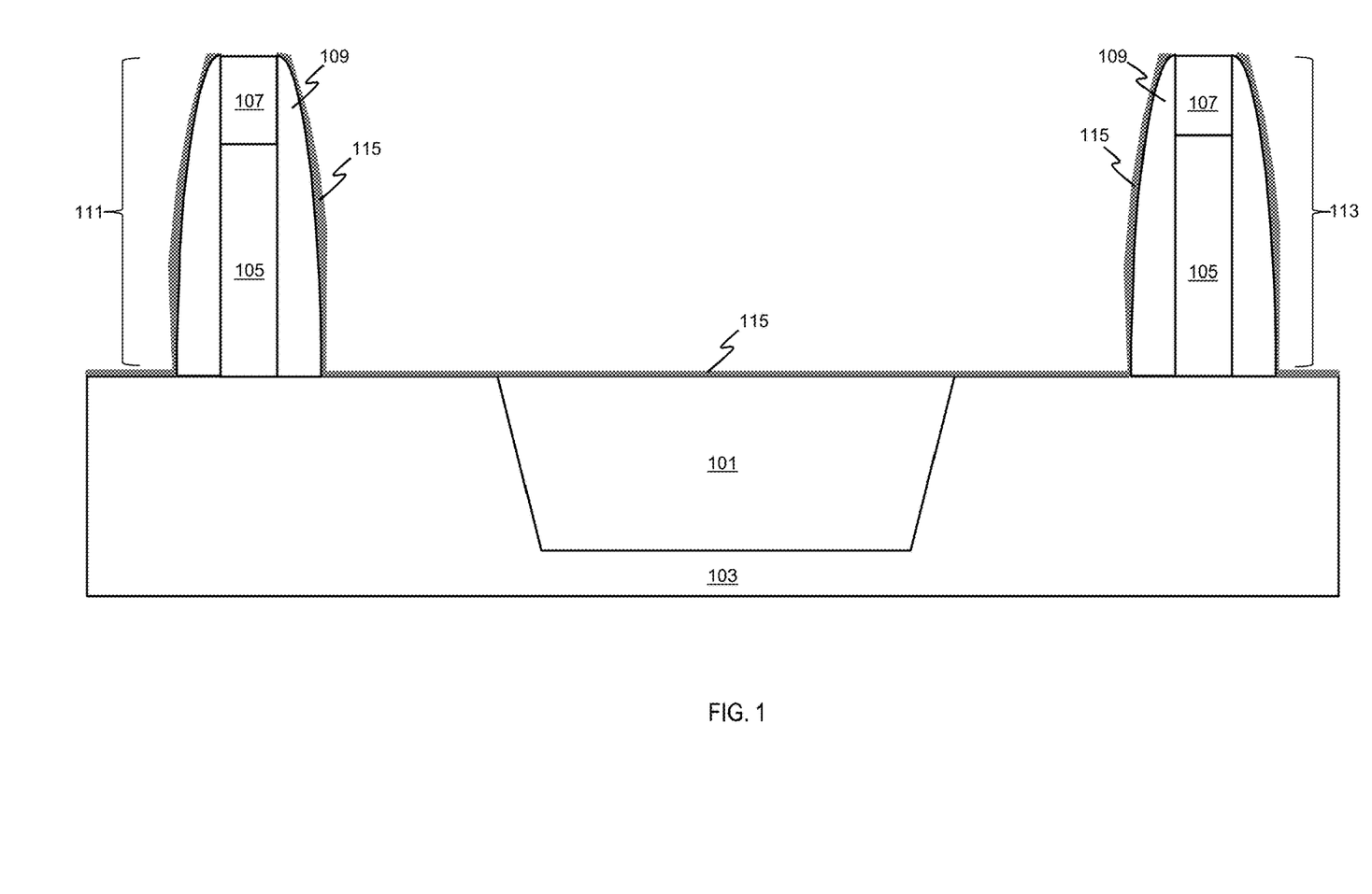
FIGS. 1 through 8 schematically illustrate cross-sectional views of a process flow of forming RM below the top surface of an HKMG structure, in accordance with an exemplary embodiment.

FIGS. 1 through 8 schematically illustrate cross-sectional views of a process flow of forming RM below the top surface of an HKMG structure, in accordance with an exemplary embodiment. Referring to FIG. 1, an STI region 101 is formed in a silicon (Si) substrate 103. The STI region 101 may contain isolating material, e.g., silicon dioxide ($SiO_2$), silicon nitride (SiN) or any other material with similar functional properties, electrically isolating regions in Si substrate 103. Replacement gates 105, e.g., dummy gates, are formed over a portion of Si substrate 103 and on the opposite sides of STI region 101. Replacement gates 105 may include suitable replacement materials, e.g., amorphous silicon (polysilicon), silicon germanium (SiGe) or any other material with similar functional properties. A hardmask (HM) 107, e.g., SiN, silicon carbide (SiC) or any other material with similar functional properties, is formed, e.g., to a thickness of about 15 nanometer (nm) to about 40 nm, over the replacement gates 105. A spacer 109, e.g., SiN, Low-k or any other material with similar functional properties, is formed, e.g., to a thickness of about 2 nm to about 4.5 nm, on the sidewalls of replacement gates 105 and HM 107, and over a portion of Si substrate 103, thereby forming gate structures 111 and 113. Subsequently, a CESL 115, e.g., SiN or any other material with similar functional properties, is formed, e.g., to a thickness of about 2 nm to about 5 nm, over STI region 101, Si substrate 103 and on the sidewalls of gate structures 111 and 113.

Figure 2:
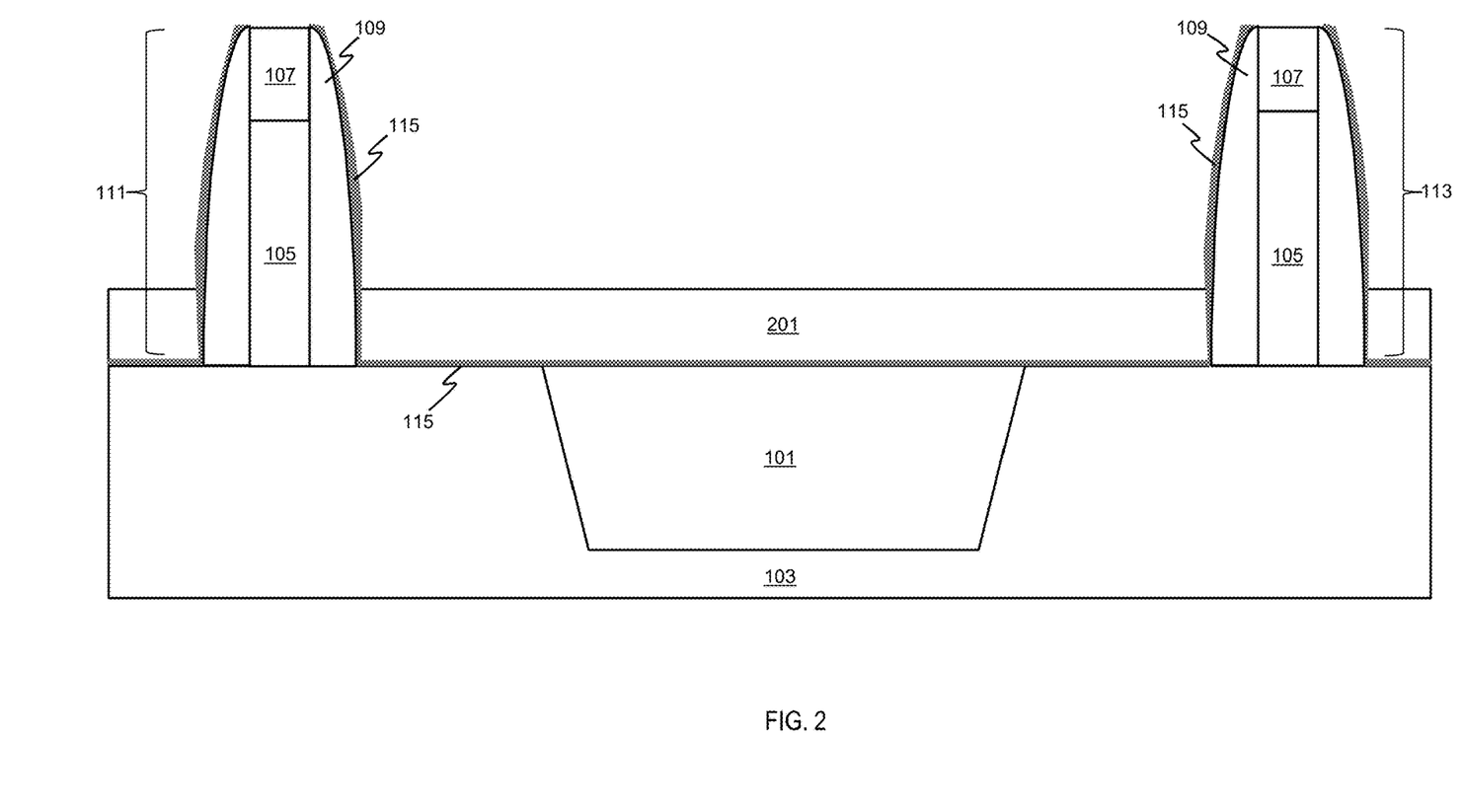
Figure 3:
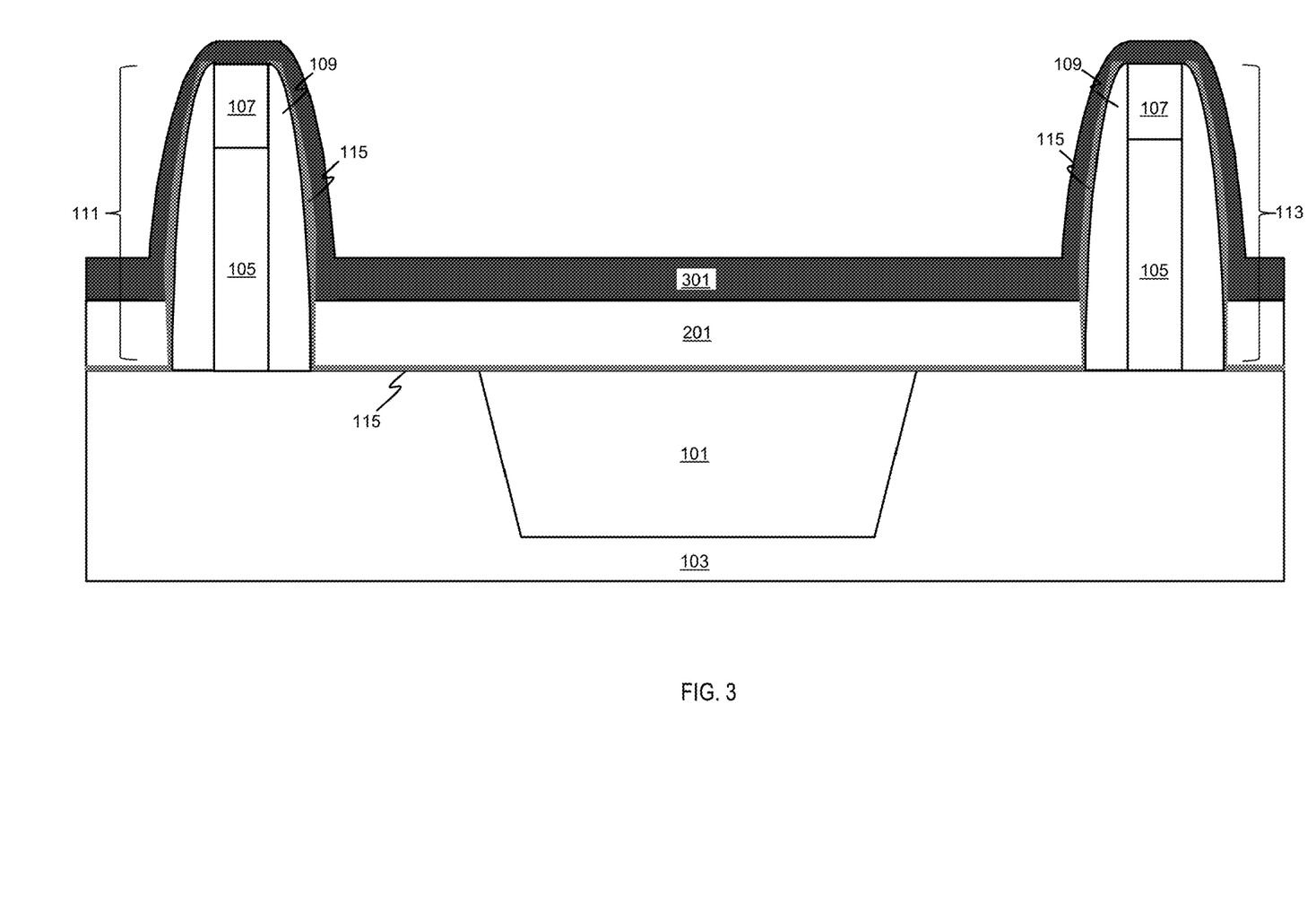
Figure 4:
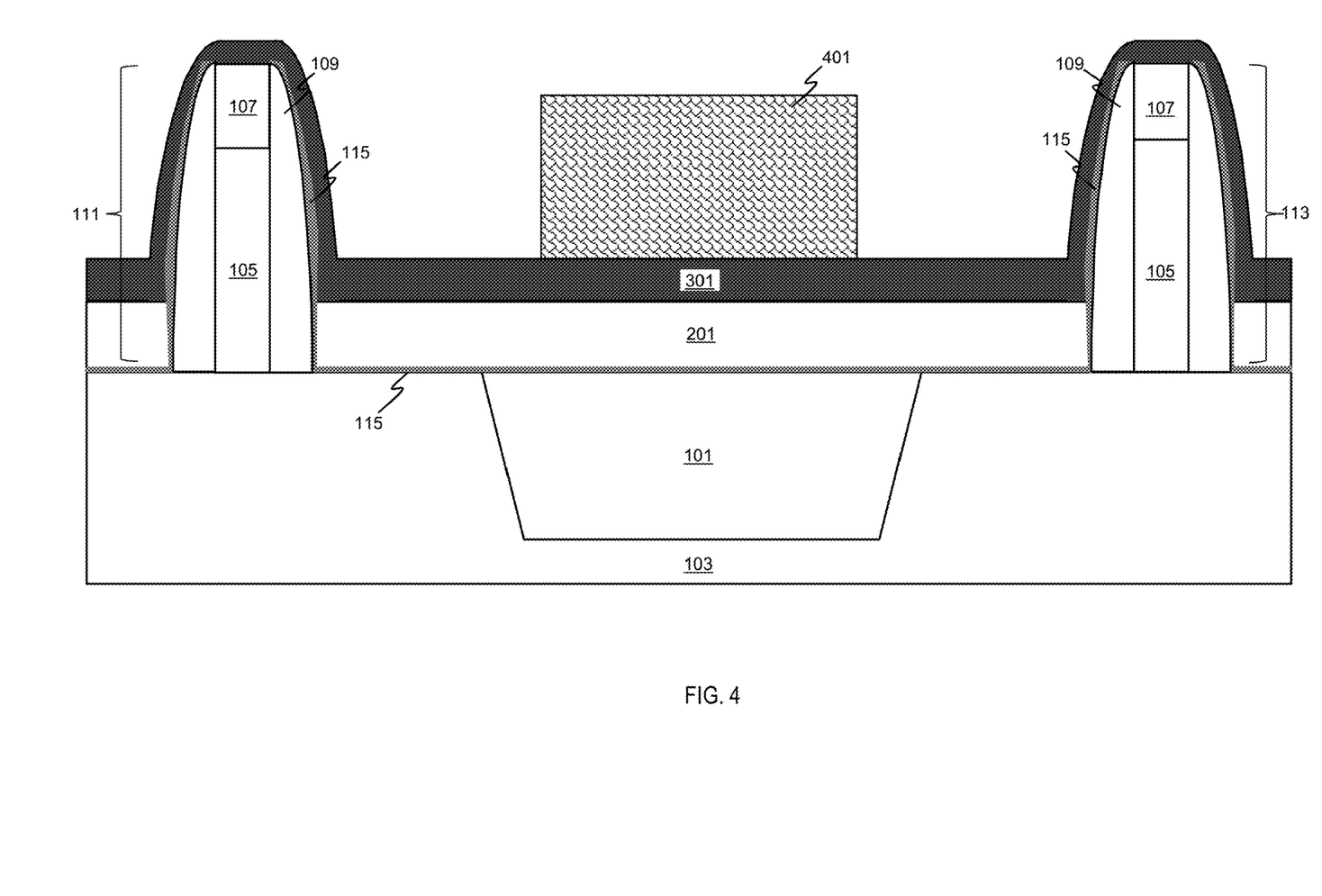
Figure 5:
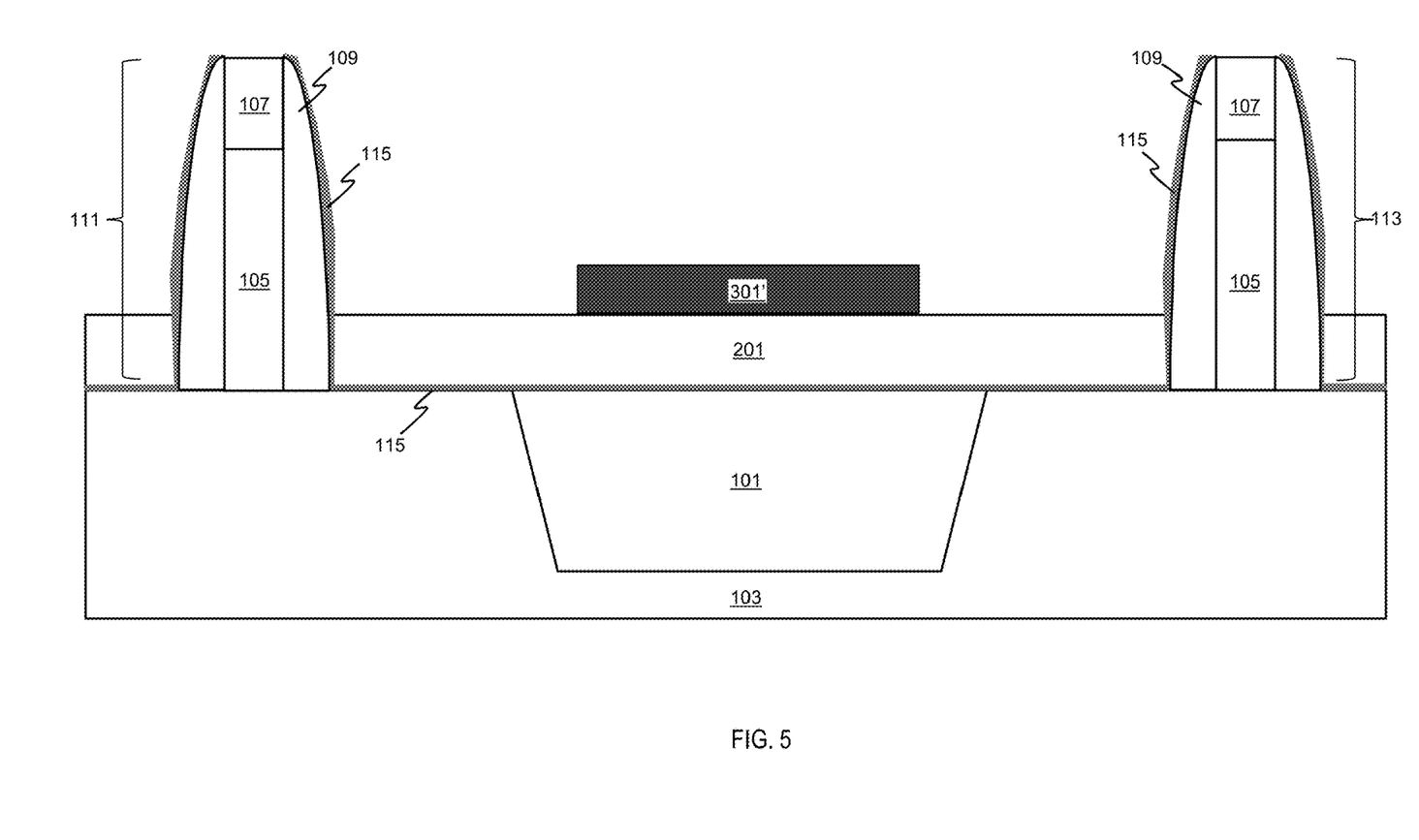

In FIG. 2, an oxide layer, e.g., flowable oxide or tetraethyl orthosilicate (TEOS), is conformally formed over CESL 115 and gate structures 111 and 113. A portion of the oxide layer is removed, thereby forming oxide layer 201 to a thickness, e.g., of about 1000 Angstrom (Å) to about 5000 Å. As depicted in FIG. 3, a WSix layer 301 is conformally formed, e.g., to a thickness of about 10 nm to about 40 nm, over the top surface of gate structures 111 and 113, CESL 115 and oxide layer 201. A resist layer 401 is formed over a portion of WSix layer 301 and between gate structures 111 and 113, as illustrated in FIG. 4. As shown in FIG. 5, a portion of WSix layer 301 is removed, e.g., by reactive-ion etching (RIE) or any other similar etching processes, forming RM 301' having a width, e.g., of about 20 nm to about 200 nm. Subsequently, resist layer 401 is removed. RM 301' may be either formed over STI region 101 or any active regions.

Figure 6:
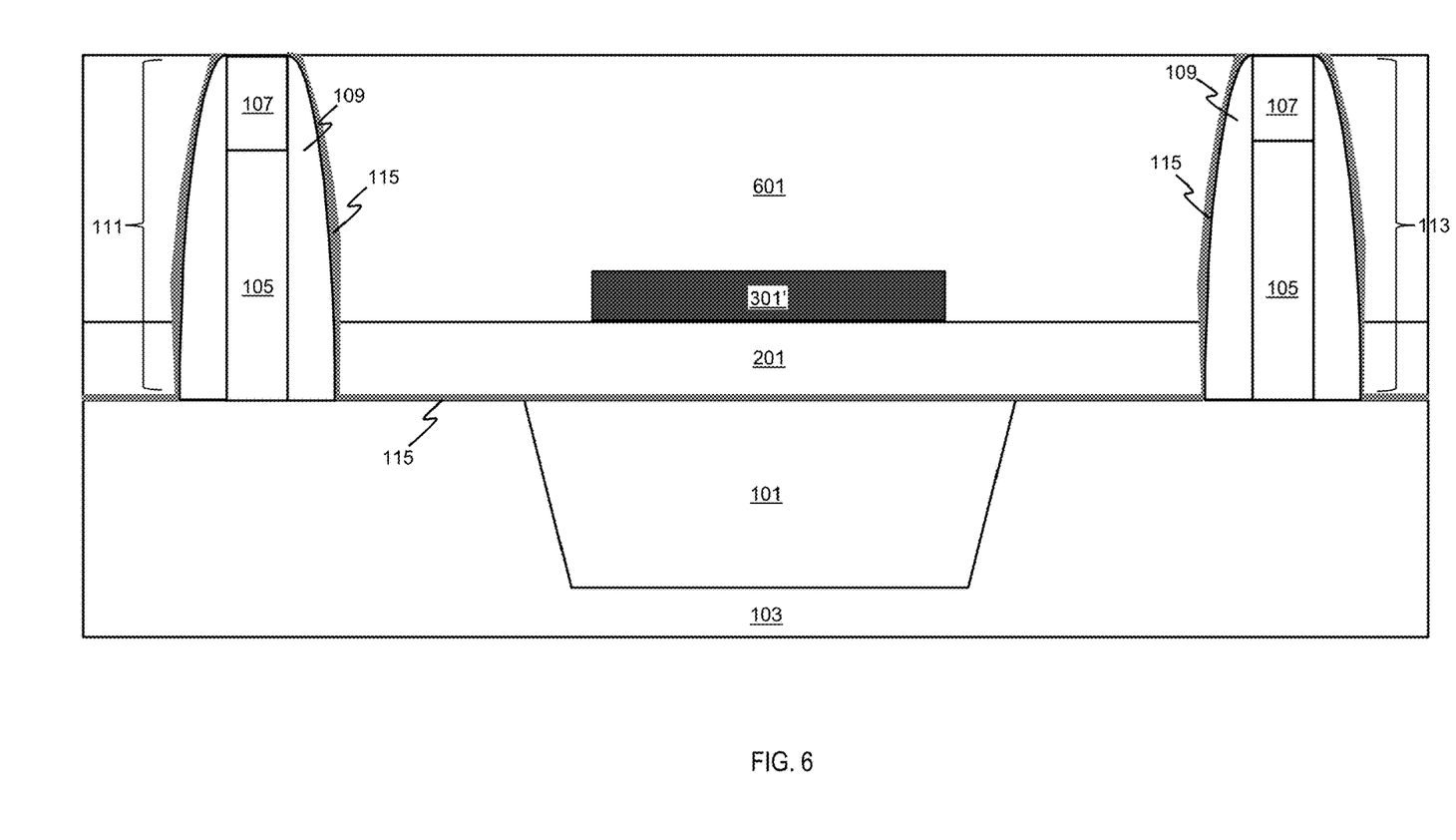

As illustrated in FIG. 6, an oxide layer, e.g., of high-density plasma (HDP) or TEOS, is conformally formed, e.g., by chemical vapor deposition (CVD) or other similar deposition techniques, over oxide layer 201, RM 301' and gate structures 111 and 113. The oxide layer is planarized, e.g., by chemical mechanical planarization (CMP) or any other similar planarization processes, forming the oxide layer 601. In this instance, oxide layer 601 has a thickness, e.g., of about 60 nm to about 110 nm, and the top surface of oxide layer 601 is substantially coplanar to the top surface of gate structures 111 and 113.

Figure 7:
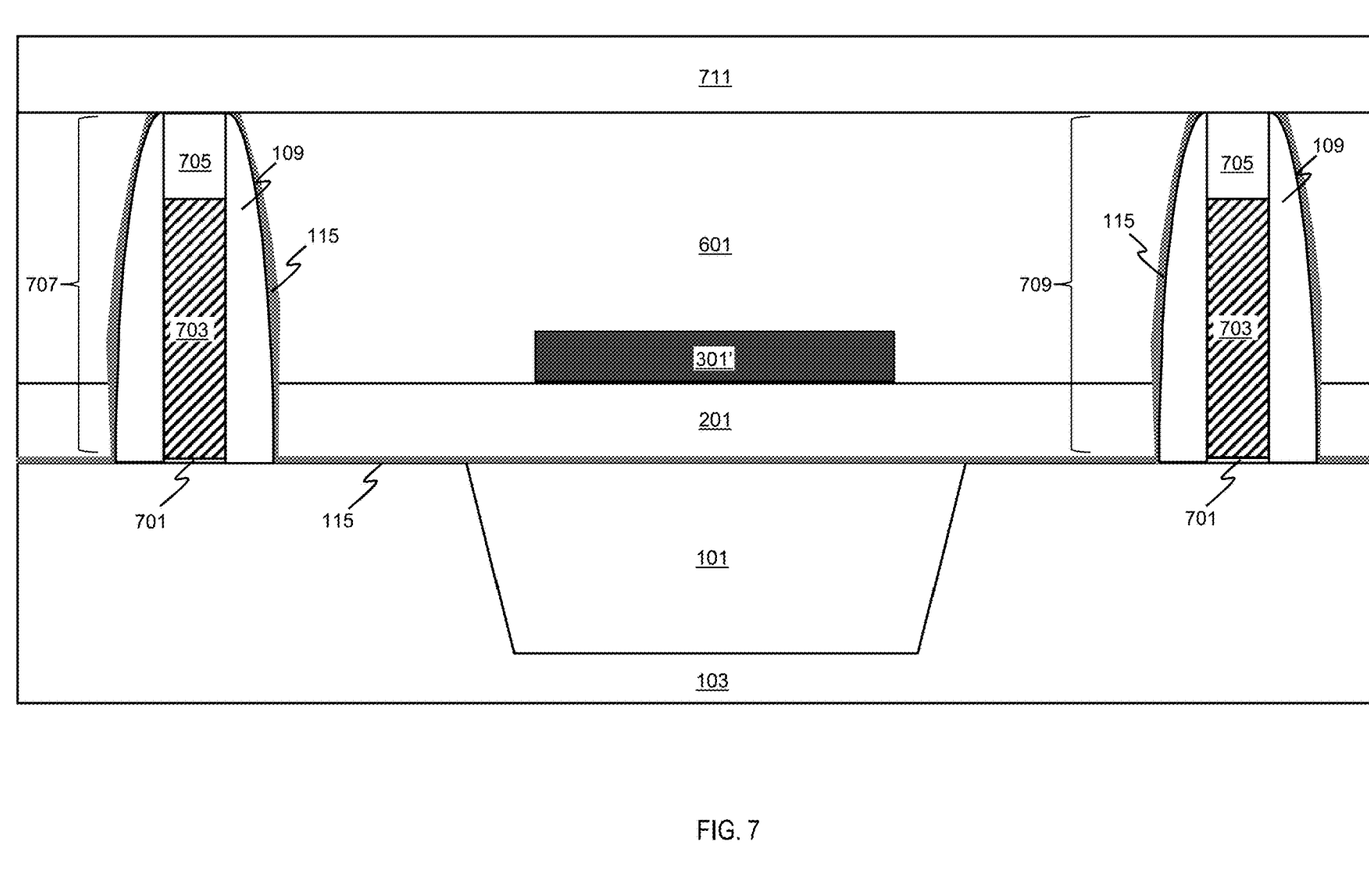

As shown in FIG. 7, HM 107 and replacement gates 105 of the gate structures 111 and 113 are removed, thereby forming first and second cavities (not shown for illustrative convenience). Next, a high-k dielectric layer 701, e.g., hafnium oxide (HfO$_x$) or any other material with similar functional properties, is formed, e.g., to a thickness of about 1.5 nm, in a portion of the first and second cavities. Thereafter, a metal layer 703, e.g., tungsten (W) or cobalt (Co) or any other material with similar functional properties is formed above the high-k dielectric layer 701 filling a portion of the first and second cavities. A HM 705, e.g., SiN, SiC or any other material with similar functional properties, is then formed in the remaining portion of the first and second cavities, thereby forming HKMG structures 707 and 709. Subsequently, MOL oxide layer 711 is formed, e.g., by CVD or other similar deposition techniques, over the oxide layer 601 and the HKMG structures 707 and 709.

Figure 8:
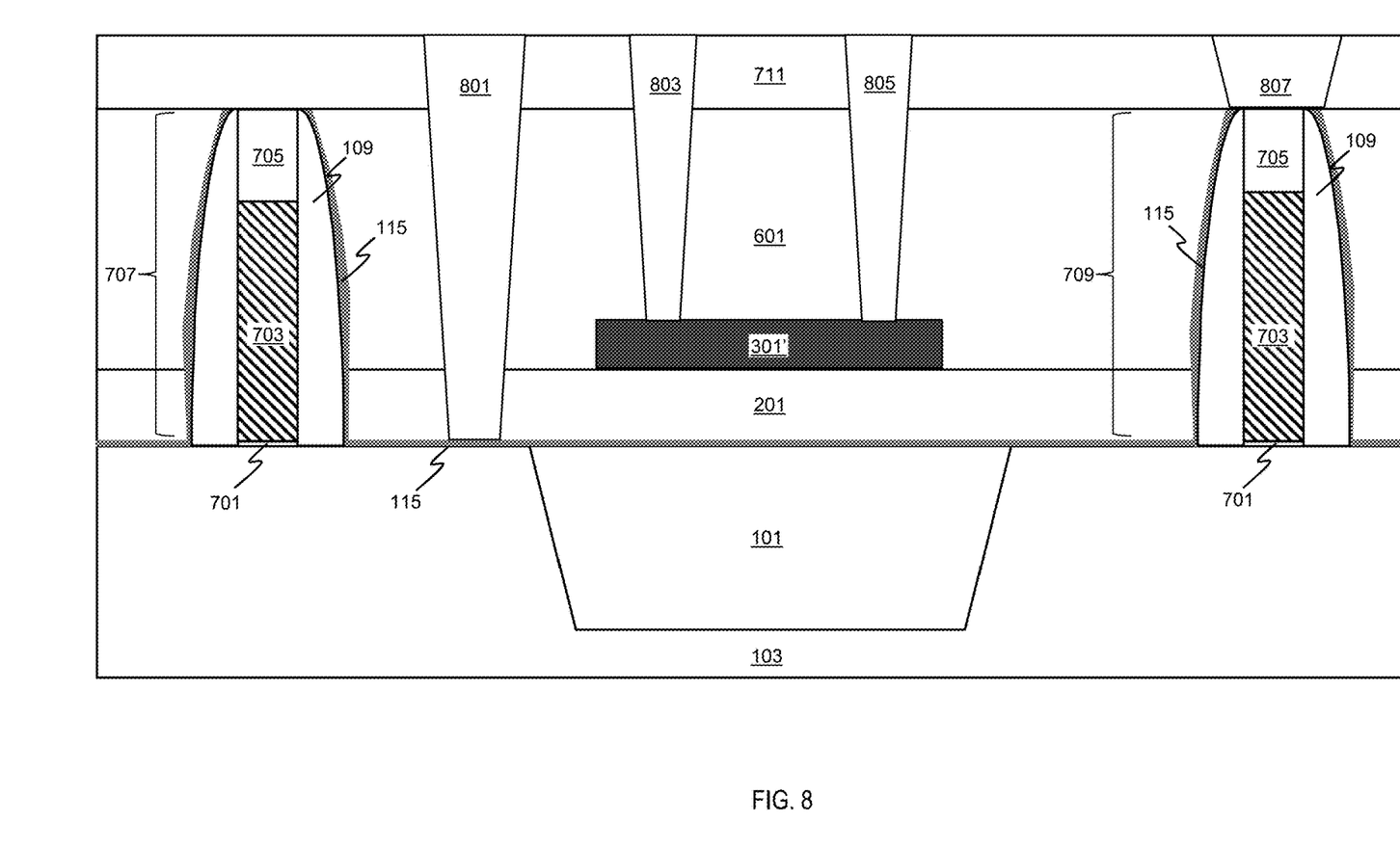

As shown in FIG. 8, a contact 801 is formed through MOL oxide layer 711 and oxide layers 601 and 201 to CESL 115 between HKMG structure 707 and RM 301'. As depicted, contacts 803 and 805 are formed through MOL oxide layer 711 and oxide layer 601 to the RM 301'. Contacts 803 and 805 may be located at different cross-section planes. Similarly, a contact 807, i.e., SAC, is formed through MOL oxide layer 711 to HKMG structure 709. Contacts 801, 803, 805 and 807 may include W or Co.

The embodiments of the present disclosure can achieve several technical effects, such as compatibility with the SAC process, and the reduced height for source/drain contact (CA) improves process window for CA-critical dimension (CD). In addition, the present method is simple and cost-effective as no additional topography or mask is required. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   first and second high-k/metal gate (HKMG) structures over a portion of a substrate and on opposite sides of a shallow trench isolation (STI) region, the first and second HKMG structures having a top surface;
   a resistor metal (RM) over the STI region and between the first and second HKMG structures, wherein the RM is below the top surface of the first and second HKMG structures;
   a contact etch stop layer (CESL) over the substrate, the STI region, and on sidewalls of the first and second HKMG structures;
   a first oxide layer over the CESL and below the RM; and
   a second oxide layer over the first oxide layer, the RM and the CESL, a top surface of the second oxide layer substantially coplanar to the top surface of the first and second HKMG structures;
   a middle-of-line (MOL) oxide layer over the second oxide layer and the first and second HKMG structures;
   a first contact extending through the MOL oxide layer, the second oxide layer and the first oxide layer to the CESL between the first HKMG structure and the RM;
   second and third contacts extending through the MOL oxide layer and the second oxide layer to the RM; and
   a fourth contact extending through the MOL oxide layer to the second HKMG structure.

2. The device according to claim 1, wherein the RM comprises tungsten silicide (WSix).

3. The device according to claim 1, wherein the first and second HKMG structures comprising:
   a high-k dielectric layer;
   a metal layer over the high-k dielectric layer;
   a hardmask (HM) over the metal layer; and
   a silicon nitride (SiN) spacer on sidewalls of the HM, the high-k dielectric layer and the metal layer, and over a portion of the substrate.

4. The device according to claim 1, wherein the CESL has a thickness of 2 nanometer (nm) to 5 nm.

\* \* \* \* \*